United States Patent [19]
Thim
[11] 3,740,666
[45] June 19, 1973

[54] CIRCUIT FOR SUPPRESSING THE FORMATION OF HIGH FIELD DOMAINS IN AN OVERCRITICALLY DOPED GUNN-EFFECT DIODE

[76] Inventor: Hartwig Thim, No. 61, Lindenstrasse, Gundelfingen, Germany

[22] Filed: Dec. 13, 1971
[21] Appl. No.: 207,083

[30] Foreign Application Priority Data
Dec. 16, 1970 Germany ................... P 20 61 834.2

[52] U.S. Cl..... 331/107 G, 317/234 V, 317/234 K, 330/5
[51] Int. Cl. ......... H03b 7/00, H03f 3/04, H03f 3/10
[58] Field of Search ................... 331/107 G; 330/5; 317/234 V, 235 K

[56] References Cited
UNITED STATES PATENTS

| | | | |
|---|---|---|---|
| 3,466,563 | 9/1969 | Thim | 331/107 G X |
| 3,490,051 | 1/1970 | Hakki et al. | 331/107 G X |
| 3,600,705 | 8/1971 | Tantraporn et al. | 331/107 G |
| 3,617,940 | 11/1971 | Copeland | 331/107 G |

*Primary Examiner*—Roy Lake
*Assistant Examiner*—Siegfried H. Grimm
*Attorney*—Markva & Smith

[57] ABSTRACT

A circuit for suppressing the formation of high field domains in an overcritically doped semiconductor diode made of Gunn-Effect material and having an anode contact (ohmic or Schottky barrier contact) and an injection limiting cathode contact. The circuit can be used as a microwave amplifier or oscillator, for instance in radar or relay systems, at frequencies in the order of up to about 100 GHz.

5 Claims, 3 Drawing Figures

PATENTED JUN 19 1973 3,740,666

Inventor
Hartwig Thim
by Markva & Smith
Attorneys

CIRCUIT FOR SUPPRESSING THE FORMATION OF HIGH FIELD DOMAINS IN AN OVERCRITICALLY DOPED GUNN-EFFECT DIODE

BACKGROUND OF THE INVENTION

This invention relates to a circuit including a semiconductor diode made of Gunn-Effect material (n-GaAs, n-InP, etc), which has an anode contact (ohmic or Schottky barrier contact) and an injection-limiting cathode contact — preferably without any band bending — on two opposite faces or points. Such a circuit can be used as a microwave amplifier or oscillator, for instance in radar or relay systems, at frequencies in the order of up to about 100 GHz.

For the range of frequencies between 4 and 100 GHz there have become known since 1964 microwave diodes which operate on the lines of the Gunn-Effect. In this connection, the negative volume conductivity of certain materials, which leads to high field domains in the Gunn-oscillator, is made use of for amplifying and generating microwaves at the transit time frequency. In order to obtain high outputs and high effectiveness at frequencies which are so high that due to the transit time limitation the Gunn-oscillators would have to be of small length, e. g. a length of 2 microns at 50 GHz, a new oscillating method has been recently developed, which was later on named "LSA (limited space charge accumulation) -mode". The LSA-diode is a Gunn-diode having a resonant circuit connected in parallel. The resonant frequency is so high that no high field domains can form during the oscillating period. The RF voltage must periodically dip into the positive mobility range below the threshold voltage, so that any small space charges, particularly the accumulating zones injected from the cathode, can be entirely quenched during one oscillating period. For this reason the resonant frequency must lie below the quenching frequency, that is below the positive dielectric relaxation frequency. The range of frequencies determined such can be mathematically formulated as follows (see J.A. Copeland: Proc. IEEE, vol. 54, pp. 1479–1480, October 1966)

$$\epsilon/9\mu + < nD/f < \epsilon/9\mu -$$

in which $n_D$ is the doping density, $\mu+$ is the positive differential mobility and $\mu-$ is the negative differential mobility. From this equation it becomes evident that the length of the LSA-diode drops out, i. e. does not determine the frequency. Another advantage is that the output power of the LSA-diode is proportional to its length. This means that at a given frequency the LSA-diode gives more power than the Gunn-oscillator, since only with the Gunn-oscillator the frequency is inversely proportional to the length. Still another advantage is that the DC to AC conversion efficiency of the LSA-diode is, theoretically, much higher than that of the Gunn-oscillator, since in the LSA-oscillator the field distribution is approximately homogeneous.

However, experiments performed up to now have shown that due to crystal inhomogeneities and fluctuations of the doping density the performance of the LSA-mode is rendered difficult if not entirely impossible. The Gunn-domains nucleated by the large inhomogeneities may be so large that it is impossible to quench them. Thus, the LSA-oscillation cannot develop. However, even if homogeneous materials (crystals) are used, it is difficult to perform the LSA-mode, since the RF amplitude must have its full magnitude in the moment the DC bias is applied, so that it may sufficiently far swing back into the positive range below the threshold voltage, thus quenching the high field domains which are forming. Otherwise a high field domain will form and absorb, particularly in long diodes, too much voltage, which will lead to an avalanche breakdown and a burn out of the diode.

In order to avoid these disadvantages, it has been proposed to homogenize the field distribution in the semiconductor diode by providing an injection limiting cathode contact (see H. Krömer, Trans. on Electron Devices, vol. ED–15, pp. 819–837, November 1968 and M.M. Atalla and J.L. Moll, Solid State Electronics, vol. 12 pp. 619–629, August 1969). However, this type of contact only prevents domains from forming at the cathode so that only the region directly adjoining the contact is stabilized. Same as before, Gunn-domains can form in the interior of the semiconductor diode, which means that the drawbacks of LSA-mode are not eliminated.

Therefore, the above references suggest subcritical doping in order to suppress the formation of Gunn-domains. The subcritically doped diode having an injection-limiting cathode has not yet been reduced to practice, probably because of the difficulties involved when applying an injection-limiting cathode to subcritically doped GaAs, which is the Gunn-Effect material almost exclusively used today. The main disadvantages of the diode with subcritical $n_D$.L- product are, however, the low power capability and the large ratio capacitance to negative conductance, the latter of which leads to narrow bandwidth.

SUMMARY OF THE INVENTION

It is the object of the invention to provide a circuit for suppressing the formation of Gunn domains in an overcritically doped semiconductor diode made of Gunn-Effect material and having an anode contact (ohmic or Schottky barrier contact) and an injection-limiting cathode contact.

To attain this object, the present invention provides a circuit in which for obtaining a small signal amplification, via a low pass filter a bias voltage $V_B$ is applied to the contacts, which bias voltage is of sufficient magnitude to reduce the negative mobility in the entire diode to a value too small to allow domain formation, according to one of the following conditions:

$$n_D \cdot L \cdot |-\mu (V_B)| \leq V_o \epsilon / 9$$

or $$n_D \cdot L^2 \cdot |-\mu (V_B)| \leq 4\pi^2 \epsilon D/9$$

for obtaining a large signal amplification diffusion for suppressing domains is employed by choosing the proper frequency $f_s$ and doping according to the condition:

$$f_s > V_o/2\pi \cdot \sqrt{9 < |-\mu(V_B)| > nD/\epsilon \cdot D}$$

and in the case of an oscillator the diode is connected to a resonant circuit the frequency $f_s$ of which is in accordance with the third formula.

In these equations $n_D$ is the doping density, L the length of the diode, $v_o$ the average electron velocity, $\epsilon$ the dielectric constant, D the diffusion constant, $q$ the electron charge, $|-\mu (V_B)|$ the absolute value of the bias-dependent mobility and $<|-\mu (V_B)|>$ its average over one period.

There are several ways to form an injection-limiting cathode contact: either a Schottky barrier contact preferably without band bending, an emitter-base (transistor) injection contact or, according to another embodiment of the invention, a positively biased Schottky gate applied laterally, and an auxiliary ohmic contact, applied in such a manner that the current injection in the zone between the Schottky gate and the anode contact (drifting zone) can be adjusted as desired due to this positive bias, preferably so that the field distribution in the drifting zone is as homogeneous as possible.

The advantages obtained by the present invention are the following:

1. The DC to AC conversion efficiency in the large signal modes has the maximum attainable value (25 percent for GaAs).

2. With a given doping level, the frequency range of a diode has no upper limit. This becomes evident when comparing the fourth formula with the LSA condition (first formula), repeated immediately below:

$$\epsilon/9\ \mu_= < n_D/f < \epsilon/9\mu_-$$

3. The starting process is not critical if the DC bias $V_B$ is first applied within a time interval equal to $\tau = 1/2\pi fs$ and $V_B$ conforms to one of the following conditions $$n_D \cdot L \cdot |-\mu\ (V_B)| \leq V_0\epsilon/9$$

or $$n_D \cdot L^2 \cdot |-\mu\ (V_B)| \leq 4\pi^2\epsilon \cdot D/9$$

so that during the starting process no Gunn-domains can form.

Once the bias is applied the load impedance can be adjusted for oscillation or the signal can be applied to be amplified.

4. The semiconductor diode can be used as a stable amplifier with overcritical doping density, but without the $n_D \cdot L$ -limitation, that is the transit time limitation, of the stable subcritically doped amplifier.

BRIEF DESCRIPTION OF THE DRAWING

Three preferred embodiments of the invention will now be described by way of example and with reference to the accompanying drawing, in which.

DESCRIPTION OF THE PREFERRED EMBODIMENTS

Figure 1:
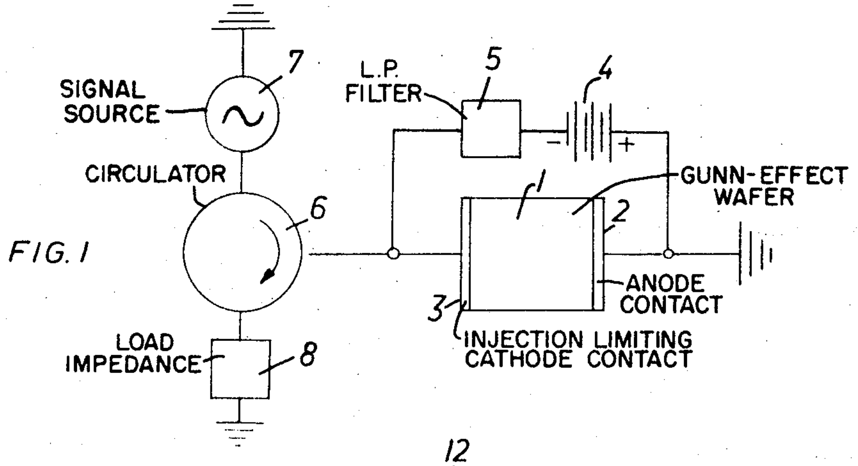
FIG. 1 is a circuit operating as a stable amplifier.

FIG. 1 shows a circuit which comprises a wafer 1 made of Gunn-Effect material on which an anode contact 2 (Schottky contact or ohmic contact) and an injection-limiting cathode contact 3 (Schottky contact) are provided. A battery 4, a low pass filter 5, and a reflection amplifying circuit comprising a circulator 6, a signaling source 7 and a load impedance 8 are connected to the contacts 2 and 3.

Figure 2:
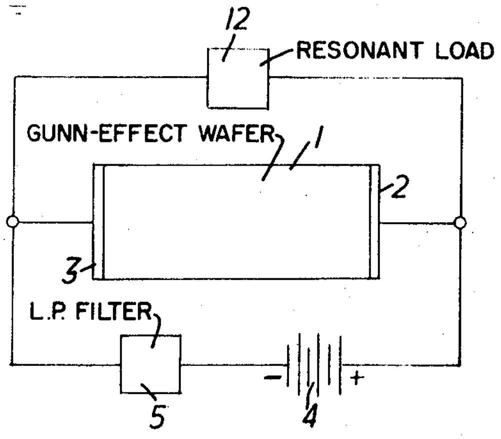
FIG. 2 is a circuit operating as an oscillator.

FIG. 2 shows the circuit operating as an oscillator, a load impedance (resonant load) 12 and, via the low pass filter 5, the battery 4 being connected to the contacts 2 (ohmic contact) and 3 (Schottky contact). This load impedance (resonant load) 12 compensates the diode impedance at a frequency corresponding to the fourth formula.

Figure 3:
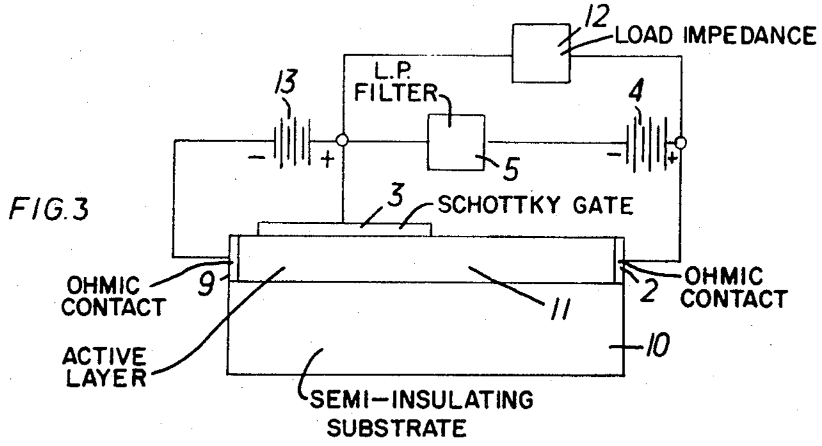
FIG. 3 is a planar structure comprising a field effect Schottky gate

FIG. 3 shows a planar structure comprising a field effect Schottky contact (gate) 3. An active layer 11 having the doping density $n_D$ was epitaxially grown on a semi-insulating substrate 10 and is contacted by two ohmic contacts 2 and 9. The Schottky contact 3 is laterally applied. The load impedance 12 is connected to the contacts 2 and 3. A battery 4 connected in series with the low pass filter 5 is likewise connected to the contacts 2 and 3. A further battery 13 is connected to the contacts 3 and 9. These connections are established in such a manner that the contact 9 lies at the negative pole of the battery 13 and the contact 3 lies at the positive pole of the battery 4. The voltage $V_B$ of the battery 4 is chosen so as to conform either to the conditions of the second, third, or fourth formula. The voltage $V_H$ of the battery 13 is so chosen that the field distribution in the drifting area of length L is homogeneous.

The invention may be embodied in other specific forms without departing from the spirit or essential characteristics thereof. The embodiments are therefore to be considered in all respects as illustrative and not restrictive.

What is claimed is:

1. A circuit comprising a semiconductor diode made of Gunn-Effect material and having an anode contact and an injection limiting cathode contact, a low pass filter, a bias voltage source and means applying a bias voltage from said source to said contacts through said low pass filter for suppressing the formation of Gunn domains, said bias voltage being of sufficient magnitude to reduce the negative mobility in the entire diode to a value too small to allow domain formation, according to the conditions $$n_D \cdot L \cdot |-\mu(V_B)| \leqslant v_0\epsilon/q$$

and $$f_s > V_o/2\pi \quad \sqrt{q < |-\mu(V_B)| > n_D/\epsilon \cdot D}$$

wherein $n_D$ is the doping density, L is the length of the diode, $V_o$ is the average electron velocity, $\epsilon$ is the dielectric constant, D is the diffusion constant, $q$ is the electron charge, $|-\mu(V_B)|$ is the absolute value of the bias-dependent negative mobility, $< |-\mu(V_B)| >$ is its average over one RF period, $V_B$ is the bias voltage and $f_s$ is the frequency of operation.

2. A circuit as defined in claim 1, wherein the injection limiting cathode contact comprises a positively biased laterally applied field effect Schottky gate and an auxiliary ohmic contact and including bias means interconnecting said Schottky gate and auxiliary ohmic contact for adjusting the current injected into the zone between Schottky gate and anode contact to make the field distribution between Schottky gate and anode contact substantially homogeneous.

3. A circuit as defined in claim 1, including a circulator and means connecting same to said diode for feeding a signal to be amplified to said diode.

4. A circuit as defined in claim 1, including a resonant load impedance and means connecting same to said contacts for providing positive feedback, whereby said circuit functions as an oscillator.

5. A circuit as defined in claim 2, including a resonant load impedance and means connecting same to said Schottky gate and anode contact for providing a positive feedback, whereby said circuit functions as an oscillator.

* * * * *